United States Patent

Patel

(10) Patent No.: US 8,797,195 B1
(45) Date of Patent: Aug. 5, 2014

(54) SMART SYNCHRO GENERATOR UNIT

(71) Applicant: Bhavesh V. Patel, Bensalem, PA (US)

(72) Inventor: Bhavesh V. Patel, Bensalem, PA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/905,208

(22) Filed: May 30, 2013

Related U.S. Application Data

(60) Provisional application No. 61/666,509, filed on Jun. 29, 2012.

(51) Int. Cl.
*H03M 1/48* (2006.01)
*H03M 1/00* (2006.01)
*H03M 1/66* (2006.01)
*H03M 1/74* (2006.01)

(52) U.S. Cl.
CPC ............... *H03M 1/485* (2013.01); *H03M 1/00* (2013.01); *H03M 1/665* (2013.01); *H03M 1/747* (2013.01)
USPC .......................................... 341/117; 341/116

(58) Field of Classification Search
CPC ....... H03M 1/00; H03M 1/665; H03M 1/485; H03M 1/747
USPC .......................... 341/116, 117, 111, 112, 144
See application file for complete search history.

(56) References Cited

U.S. PATENT DOCUMENTS

| | | |
|---|---|---|
| 3,618,073 A | 11/1971 | Domchick et al. |
| 3,993,993 A * | 11/1976 | Griffin .......................... 341/117 |
| 3,997,893 A | 12/1976 | Games et al. |
| 4,017,846 A | 4/1977 | Aramaki |
| 4,062,005 A | 12/1977 | Freed et al. |
| 4,164,729 A | 8/1979 | Simon et al. |
| 4,216,466 A | 8/1980 | Chasson et al. |
| 4,281,316 A | 7/1981 | Simon et al. |
| 4,375,636 A | 3/1983 | Stack et al. |
| 4,401,932 A | 8/1983 | Hermansdorfer et al. |
| 4,430,640 A | 2/1984 | Hermansdorfer et al. |
| 4,954,753 A | 9/1990 | Sikora |
| 5,034,743 A | 7/1991 | Deppe et al. |

(Continued)

OTHER PUBLICATIONS

U.S. Appl. No. 61/666,509, co-pending, invention entitled "Smart Synchro Generator Unitt," filed Jun. 29, 2012, sole inventor Bhavesh V. Patel.
U.S. Appl. No. 13/487,701, co-pending, invention entitled "Hybrid Digital-to-Synchro Converter Unit,"filed Jun. 4, 2012, sole inventer Bhavesh V. Patel.

*Primary Examiner* — Joseph Lauture
(74) *Attorney, Agent, or Firm* — Howard Kaiser

(57) ABSTRACT

The present invention is typically embodied as a portable handheld unit that generates synchro signals for input into synchro motors and other synchro devices. A primary genre of inventive application is the testing of hardware and software in synchro systems. The inventive unit typically includes a numeric keypad, an LCD display, a microcontroller, a serial-to-parallel binary data converter, and at least one digital-to-synchro converter. The keypad and display are used to enter decimal data. The microcontroller converts the decimal data to serial binary data. The serial-to-parallel binary data converter converts the serial binary data to parallel binary data. The digital-to-synchro converter(s) convert(s) the parallel binary data to synchro analog data. Some inventive embodiments implement plural digital-to-synchro converters individually corresponding to channels for independently outputting synchro signals. Each channel can represent a specific type of synchro operation, e.g., ship rudder angle, ship speed, ship engine shaft revolution, ship heading, etc.

20 Claims, 18 Drawing Sheets

(56) References Cited

U.S. PATENT DOCUMENTS

| | | |
|---|---|---|
| 5,173,696 A | 12/1992 | Howard et al. |
| 5,646,496 A | 7/1997 | Woodland et al. |
| 6,069,576 A | 5/2000 | Gwin |
| 6,172,627 B1 | 1/2001 | Nealy et al. |
| 6,222,469 B1 | 4/2001 | Goode, III et al. |
| 6,961,233 B2 | 11/2005 | Hoeing et al. |
| 8,193,955 B2 | 6/2012 | Hermann |

* cited by examiner

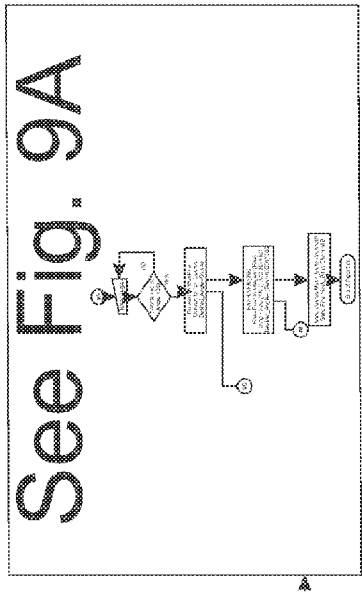
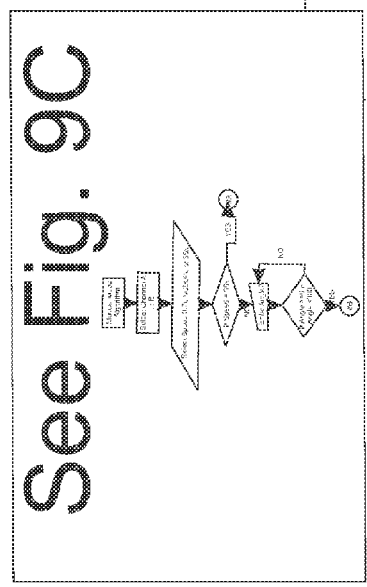
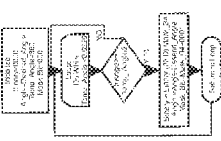
FIG. 9

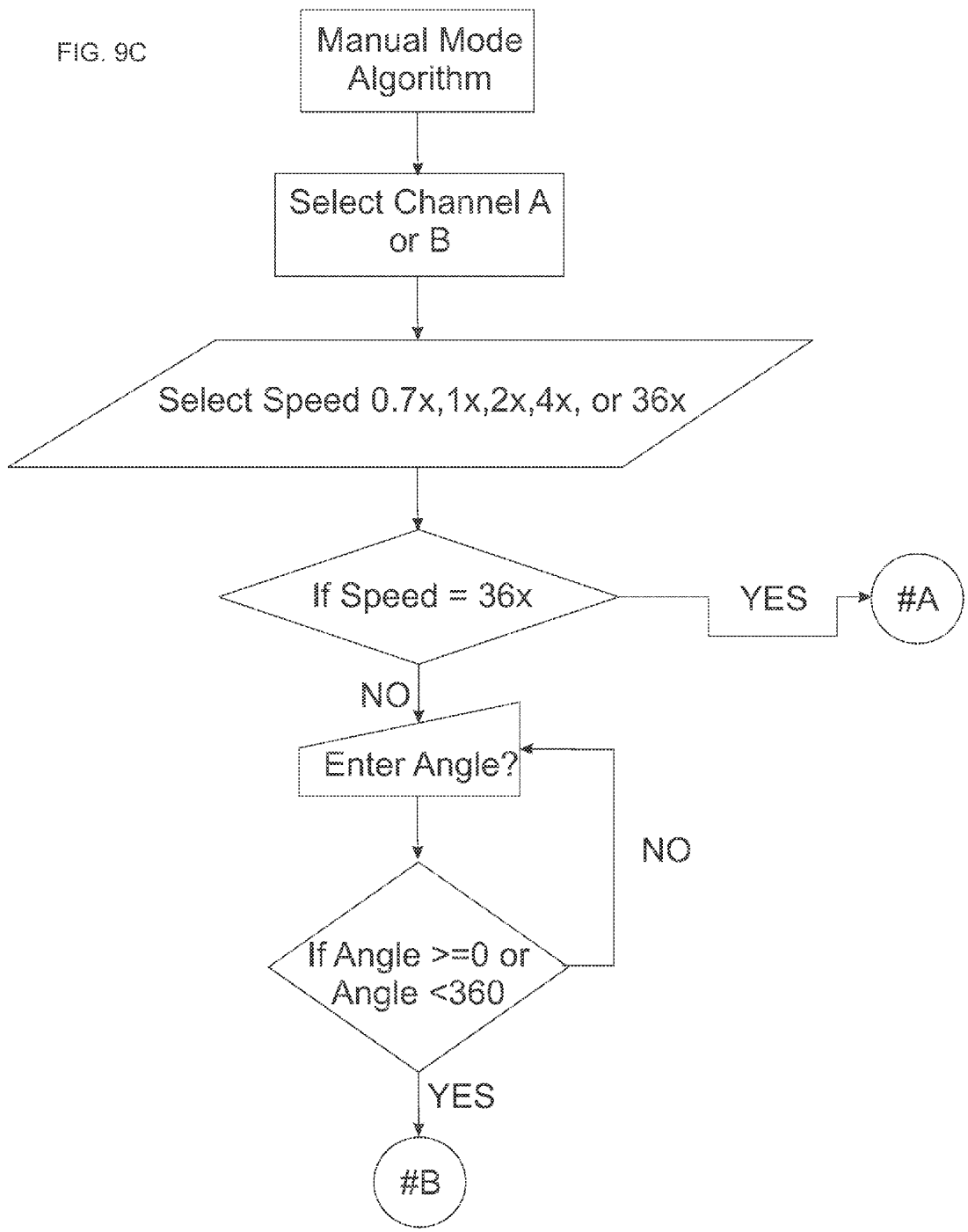

SMART SYNCHRO GENERATOR UNIT

CROSS-REFERENCE TO RELATED APPLICATIONS

This invention claims the benefit of U.S. provisional application Ser. No. 61/666,509, incorporated herein by reference, filing date 29 Jun. 2012, title "Smart Synchro Generator Unit," inventor Bhavesh V. Patel.

BACKGROUND OF THE INVENTION

The present invention relates to synchros, more particularly to methods and devices for generating synchro signals.

Synchros are analog electronic devices that provide angular or similar information pertaining to navigation, communication, detection, weaponry, etc. Synchros have been used for some time in many defense, commercial, and maritime applications, and have been regarded to be reliable, robust, and accurate. Generally speaking, a synchro operates in the manner of a rotary electrical transformer, and serves to measure and set the angle of a rotating device.

Synchro signals are analog signals. A synchro receives synchro signals, and these actuate the synchro. Traditionally, synchro signals are in the form of a three-signal (e.g., three-wire) synchro output representing angular data. For instance, a digital-to-synchro converter may output analog angular data corresponding to binary-coded decimal digital input.

A synchro can implement the analog angular data to set the azimuth of a satellite dish, the direction of an antenna, the angle of a ship rudder, the trajectory of a weapons system, etc. Desired angles may be entered through a computer interface, which sends a digital signal to a digital-to-synchro converter, which in turn generates an equivalent synchro signal to actuate the synchro to the proper angle.

Traditional synchro meters have been used, during installation and onboard troubleshooting, to take five inputs and display an angle representing a unique phase and amplitude of each synchro signal. However, a traditional synchro meter does not generate synchro signals that can be fed into a system for testing purposes.

This functionality—viz., generation of synchro signals—is useful in verifying proper cable connections, testing hardware that receives synchro signals, and testing software that receives digital values from the hardware that converts the synchro signals to digital signals. The tested software may be designed, for instance, to bring about display of numbers, graphics, or boolean data, based on conversion of synchro to a digital format.

The few commercially available synchro generators generate a synchro signal by rotating a rotor to set up different angles. Conventional synchro generators are limited in their inability to generate more than one type of synchro signal, e.g., 1×, 2×, 3×, 4×, 10×, etc. A synchro rotor of 2× design, for instance, cannot be used to input 4× or 1× signals. Therefore, a customer must purchase separate conventional synchro generators according to various requirements.

Furthermore, since conventional synchro generators require an external force in order to rotate, they are incapable of effecting smart simulation of ship parameters such as rudders, speed, revolutions per minute (RPM), or heading. Moreover, conventional synchro generators tend to be large and heavy, lack a display system for verifying output signals vis-à-vis received signals, and cannot generate customized synchro signals (for instance, a rarely used synchro signal such as 0.7×, for which no conventional synchro generators are available).

When any hardware or software is defective, or synchro signals (R1, R2, S1, S2, S3) are not matching at a connection point, the received value may be incorrect, or may damage the recipient hardware. Post-installation testing and troubleshooting may require large amounts of time to determine a wrong cable connection at a junction box or to hardware. In order to avoid problems such as damage to hardware, it is desirable to reduce troubleshooting time or pre-verification time relating to transmission of synchro signals.

In addition, during installation on ships, sources that generate synchro signals are not energized for safety reasons, and hence data received in synchro signal form cannot be verified until the ship's crew powers up the sources. Hence, an additional need is the capability of generating synchro signals during these periods in which sources are unavailable.

An instructive resource on synchros is the Synchro/Resolver Conversion Handbook, Fourth Edition, 1994, Library of Congress Catalog Number 74-77038, Data Device Corporation (DDC), 105 Wilbur Place, Bohemia, N.Y. (electronic version, 125 pages, available in pdf at the DDC website).

Incorporated herein by reference is U.S. Pat. No. 8,193,955 B2, entitled "Modular Units for Synchro-to-Digital Conversion and Digital-To-Synchro Conversion," issued 5 Jun. 2012, inventor Charles J. Hermann.

Also incorporated herein by reference is co-pending U.S. nonprovisional patent application Ser. No. 13/487,701, entitled "Hybrid Digital-to-Synchro Converter Unit," filed 4 Jun. 2012, inventor Bhavesh V. Patel.

SUMMARY OF THE INVENTION

In view of the foregoing, it is an object of the present invention to provide improved method and apparatus for generating synchro (analog) signals representative of selected angularities, for purposes of testing synchro and synchro-related equipment.

In accordance with typical practice of the present invention, decimal data is entered, by a user, in a human-machine interface (which includes a numeric keypad and an LCD display). The decimal data is converted, by a microprocessor (which contains in its memory a decimal-to-binary algorithm for processing the decimal data entered), to serial binary data. The serial binary data is converted, by a serial-to-parallel binary data converter, to parallel binary data. The parallel binary data is converted, by at least one digital-to-synchro converter, to synchro analog data. Inventive practice can provide for plural channels by attributing individual inventive units with plural channels, and/or by connecting plural inventive units in a serial master-slave configuration.

The present invention can be embodied so as to be capable of generating a constant synchro signal, and/or a continuous synchro signal simulation of data such as ship rudder angle data, rudder angle order data, ship engine shaft revolutions per minute (RPM) data, ship speed data, ship heading data (coarse and/or fine), etc. A "simulation" mode of inventive practice can perform customized processing insofar as automatically treating entered decimal data as falling into a particular synchro category (e.g., ship rudder angle, ship speed, ship engine shaft revolution, or ship heading). Some embodiments of the present invention are referred to by the present invention as the "Smart Synchro Generator/Simulator," or "SSGS."

It is expensive and impractical to implement actual synchro sources in multiple numbers for various configurations. The inventive device can obviate the need for the actual source unit or units, for purposes of testing and troubleshooting existing systems—for instance, with respect to synchro cable connectivity, synchro cable matching, hardware, and software. Testing and troubleshooting can be easy and timesaving using an inventive device that can generate a valid synchro signal. In the absence of synchro signals, other message formats such as NMEA cannot be verified.

A typical inventive synchro generation device provides for customized setup and configuration using a keypad and an LCD screen, and is user-friendly and quick to generate stable or simulated synchro signals. Typical inventive practice offers flexibility to users through multiple mode selection, user-defined synchro signal types, simulation, and ease of transportation.

BRIEF DESCRIPTION OF THE DRAWINGS

The present invention will now be described, by way of example, with reference to the accompanying drawings, wherein:

FIG. 9 is a flow diagram illustrating an overview of typical practice of "Manual" synchro signal generation in accordance with the present invention. FIG. 9A, FIG. 9B, and FIG. 9C are enlarged portions of FIG. 9, illustrating algorithmic details and together representing the entire FIG. 9.

Figure 1:
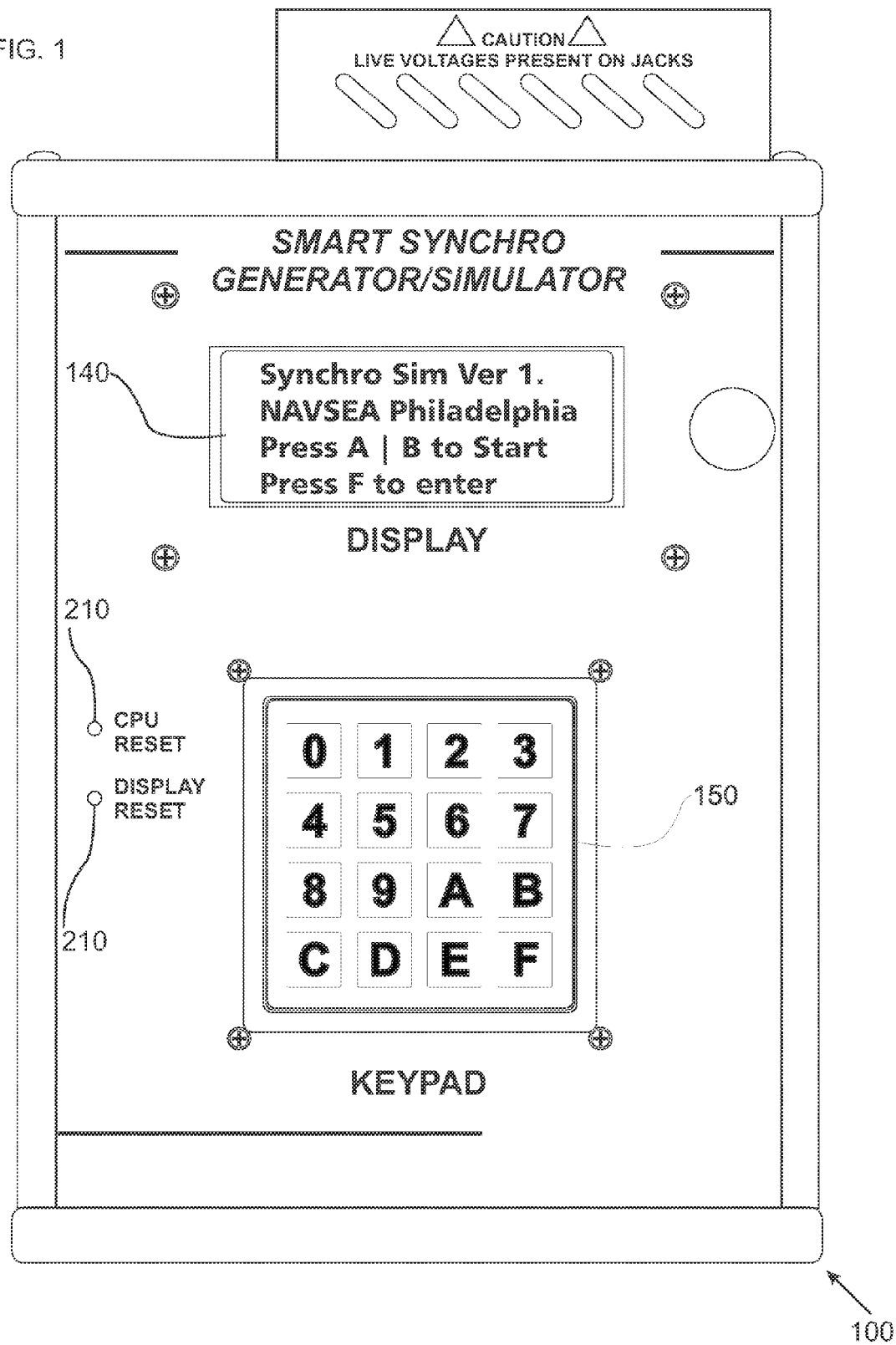
FIG. 1 is a photographic top plan view of a United States Navy prototype of a synchro signal generator unit in accordance with the present invention. The LCD display is slightly enhanced for illustrative purposes.

DESCRIPTION OF EXEMPLARY
EMBODIMENTS OF THE INVENTION

Referring now to FIGS. 1 through 8, the inventive synchro signal generation prototype 100 includes two digital-to-synchro converters 110 (viz., 110a and 110b), a microcontroller 120, a serial-to-parallel binary data converter (e.g., serial port controller) 130, an interface 1450 including an LCD readout 140 and a keypad 150, a phase swap switch 160, an ICP programming connector 170, an AC/DC power supply 180, a parallel binary data bus (e.g., data bus chip) 190, and two re-set buttons 210. Although two digital-to-synchro converters 110 are shown in this example, inventive practice is possible providing for one digital-to-synchro converter 110 or practically any plural number of digital-to-synchro converters 110.

Figure 8:
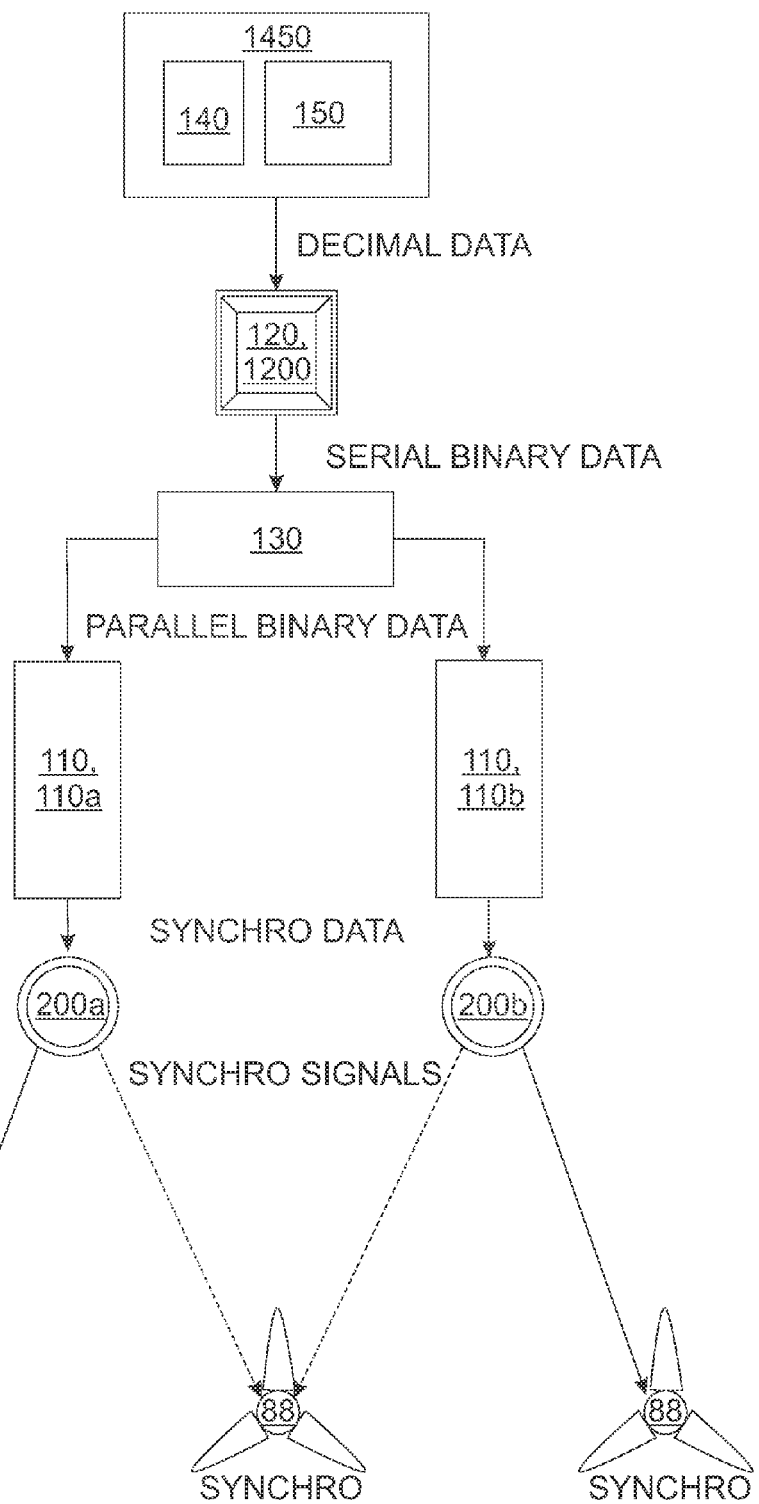
FIG. 8 is a schematic illustrative of typical practice of synchro signal generation in accordance with the present invention.

Particularly with reference to FIG. 8, human-machine interface 1450 is used for entering decimal data. Computer 120 has includes a processor and a memory, and has resident in its memory a mathematical algorithm for converting decimal data, entered via HMI 1450, to serial binary data. Serial-to-parallel binary data converter 130 converts serial binary data, received from computer 120, to parallel binary data. Each digital-to-synchro converter converts parallel binary data, received from serial-to-parallel binary data converter 130, to synchro analog data. The synchro analog data output by each digital-to-synchro converter is suitable for conveyance in synchro signal form (e.g., as S1, S2, R1, R2, and R3 signals) to a synchro.

The present invention is frequently practiced whereby the inventive device is characterized by at least two channels. Each channel has a different digital-to-synchro converter and is separately connectable to a synchro for independent conveyance of at least some synchro analog data, in synchro signal form, to the synchro. Each channel independently transmits synchro analog data signals. According to some inventive embodiments, each channel transmits synchro analog data signals to a different synchro; that is, there is one-to-one correspondence between the channels and the synchros. According to other inventive embodiments, at least two channels transmit synchro analog data signals to the same said synchro; that is, at least one synchro is fed by plural channels.

Figure 7:
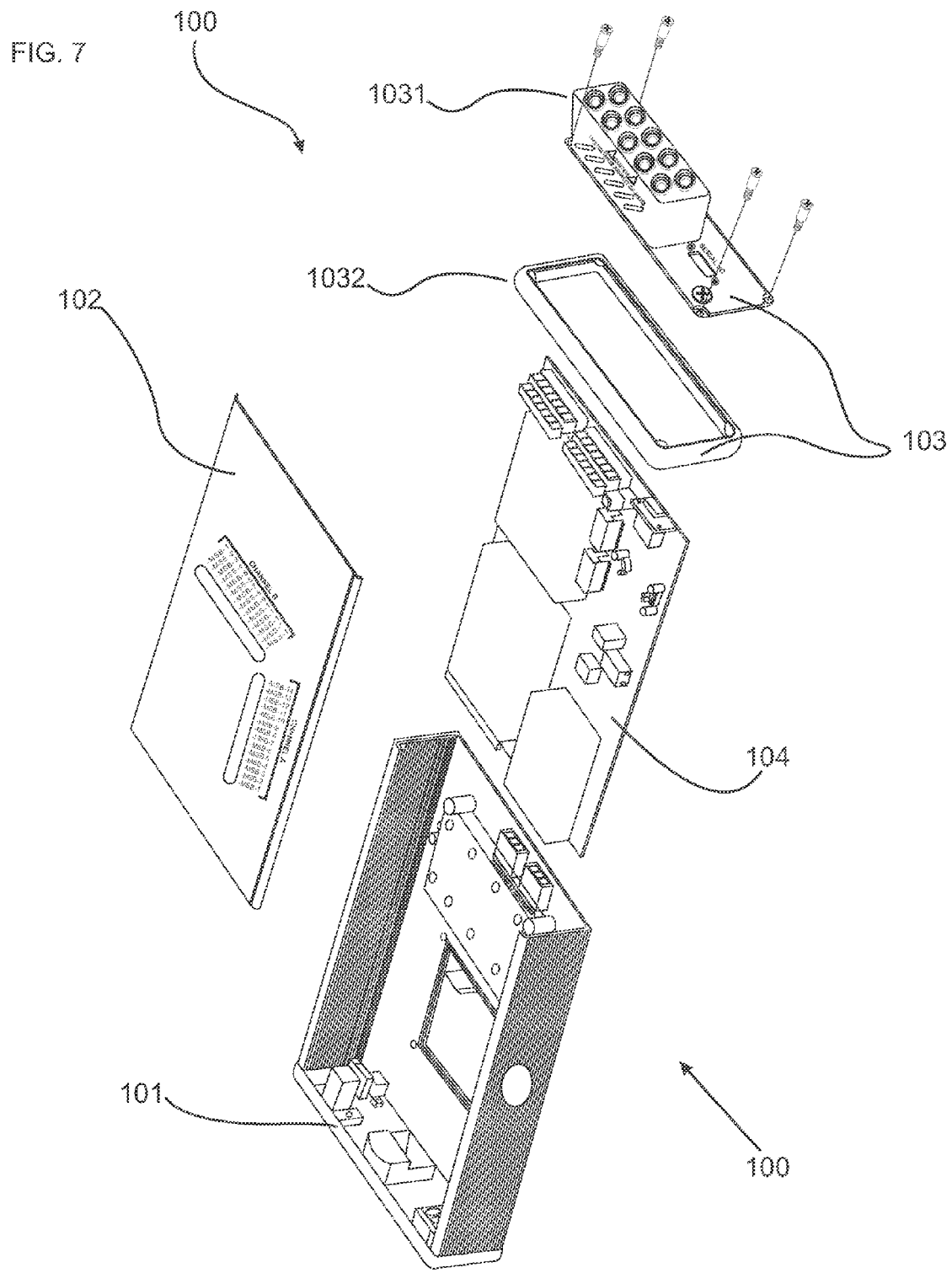
FIG. 7 is an exploded diagrammatic perspective view of the inventive prototype shown in FIG. 1.

The depicted inventive device 100, a compact portable unit that can be handheld and that generally describes a rectangular prismatic shape, is representative of an inventive mode of apparatus that the present inventor calls the "Smart Synchro Generator/Simulator" ("SSGS"). As shown in FIG. 7, inventive device 100 is assembled from four main sections, viz., box-shaped frame 101, back plate 102, end section 103, and printed circuit board (PCB) assembly 104. Box-shaped frame 101 includes the front face displayed in FIG. 1, and the end portion displayed in FIG. 4. Back plate 102 is displayed in FIG. 2. End section 103 includes an end joint 1031 and a synchro signal port component 1032.

In referring to inventive synchro signal generation prototype 100, the terms "inventive device" and "inventive unit" are used interchangeably herein. As shown in FIG. 1, the depicted inventive device interfaces well with the user via an easy input keypad (16 Hex) and a clear output display (4×20 LCD screen), for selecting all of the necessary settings. The backlight of the LCD screen, controlled by a DIM potentiometer, facilitates use in poorly lit areas.

Figure 5:
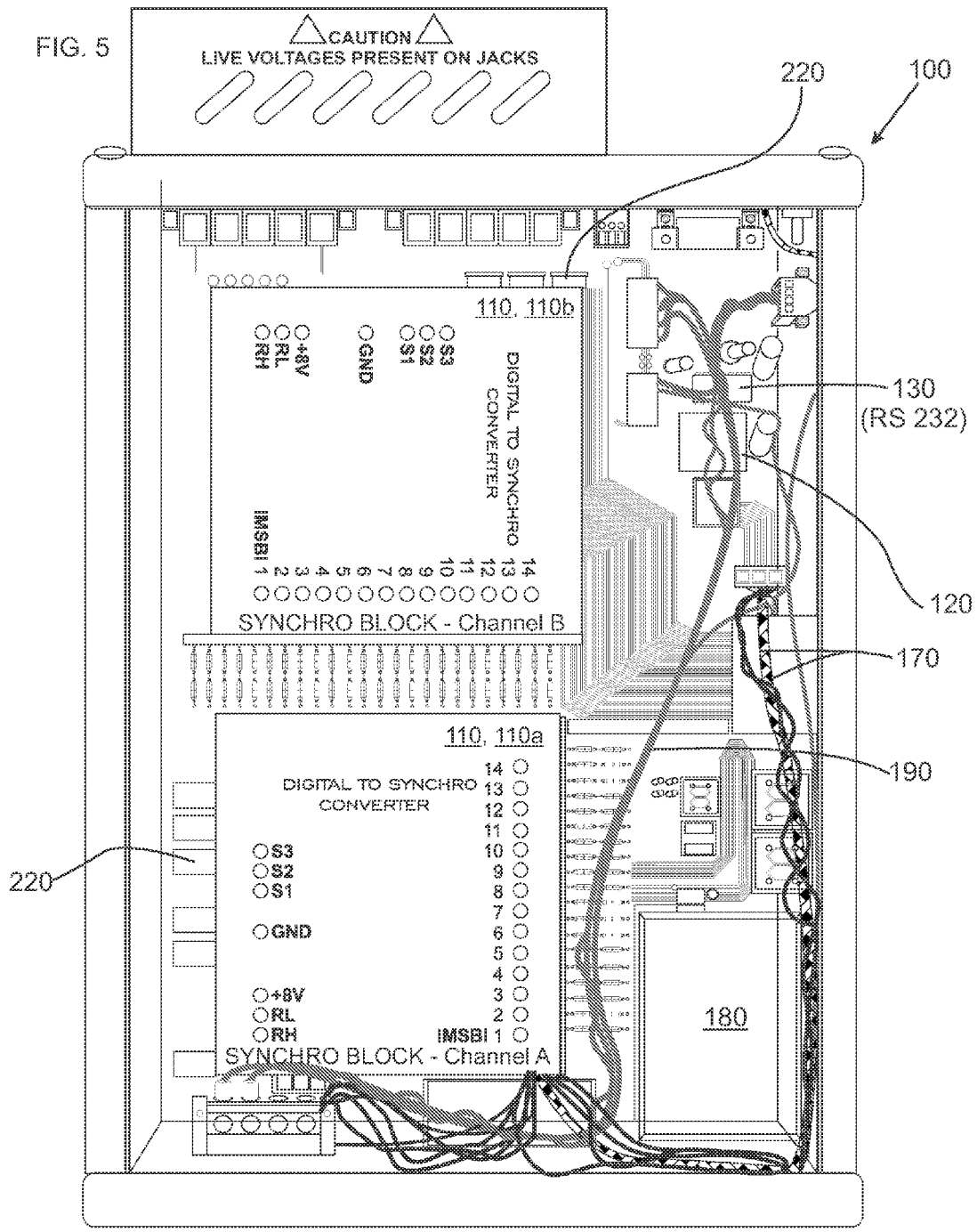
FIG. 5 is a photographic top plan view, with the top face removed and internal components and circuitry revealed, of the inventive prototype shown in FIG. 1.
Figure 6:
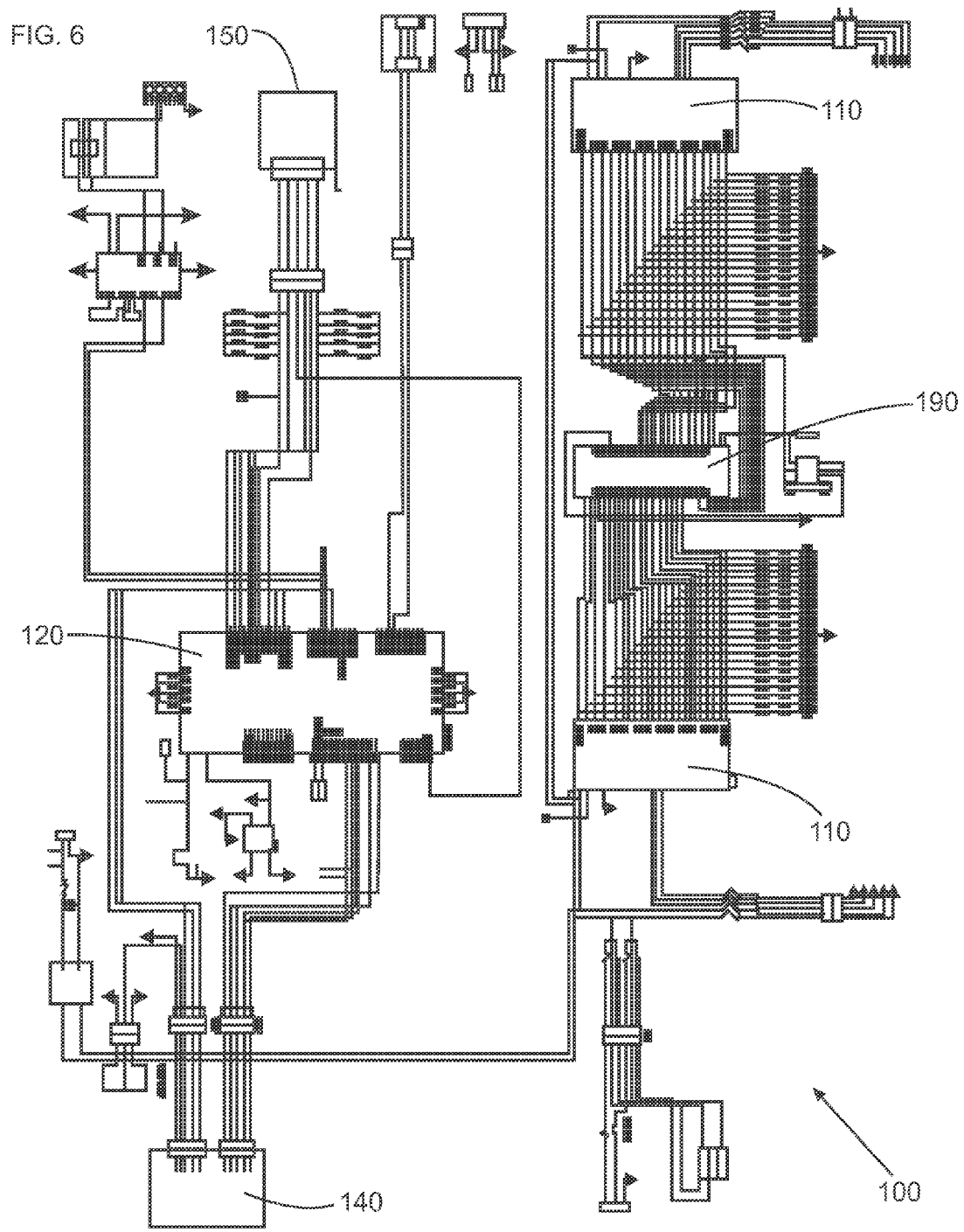
FIG. 6 is a circuit diagram of the inventive prototype's components and circuitry shown in FIG. 5.

As shown in FIG. 5 and FIG. 6, power supply 180 is a TDK-Lambda model AC/DC power supply. Microcontroller 120 is shown to be a digital signal controller, model dsPIC 30f6014A controller (I2C data bus chip) manufactured by Microchip Technology. Each of the digital-to-synchro converters 110a and 110b is shown to be a model DS P60-H-1 RP manufactured by Computer Conversions Corporation. The internal main controller board is equipped with an I2C data bus chip, a dsPIC30F6014A 80-pin controller, external oscillator for 16× speed to accomplish floating points operations. The onboard I2C two-pin connector and serial bus port are also embedded for daisy chain interface of the inventive device 100. The re-set buttons are mounted on the printed circuit board to reset controller and I2C data bus IC under exigent circumstances.

To further portability of the inventive device 100, the output cables that connect the inventive device to hardware or other cables are removable (e.g., detachable). The five output cables for each channel can be alligator clips that allow for easy connection to wires and hardware. On the other end the cables each connect to one detachable connector, such as a Phoenix connector (e.g., right angle or horizontal) or a Pomona connector, which can be clipped onto the body of the inventive device.

A powerful fan (e.g., 5V) can be implemented to keep internal circuitry cool in order to improve operation in very hot temperatures. Heat generated by the components was taken into consideration by the present inventor during the prototype design stage. The inventive device can includes a combination of a vent system and a fan exhaust system at opposite ends in order to provide good air circulation, thereby enhancing robustness and practicability outside the lab.

Figure 3:
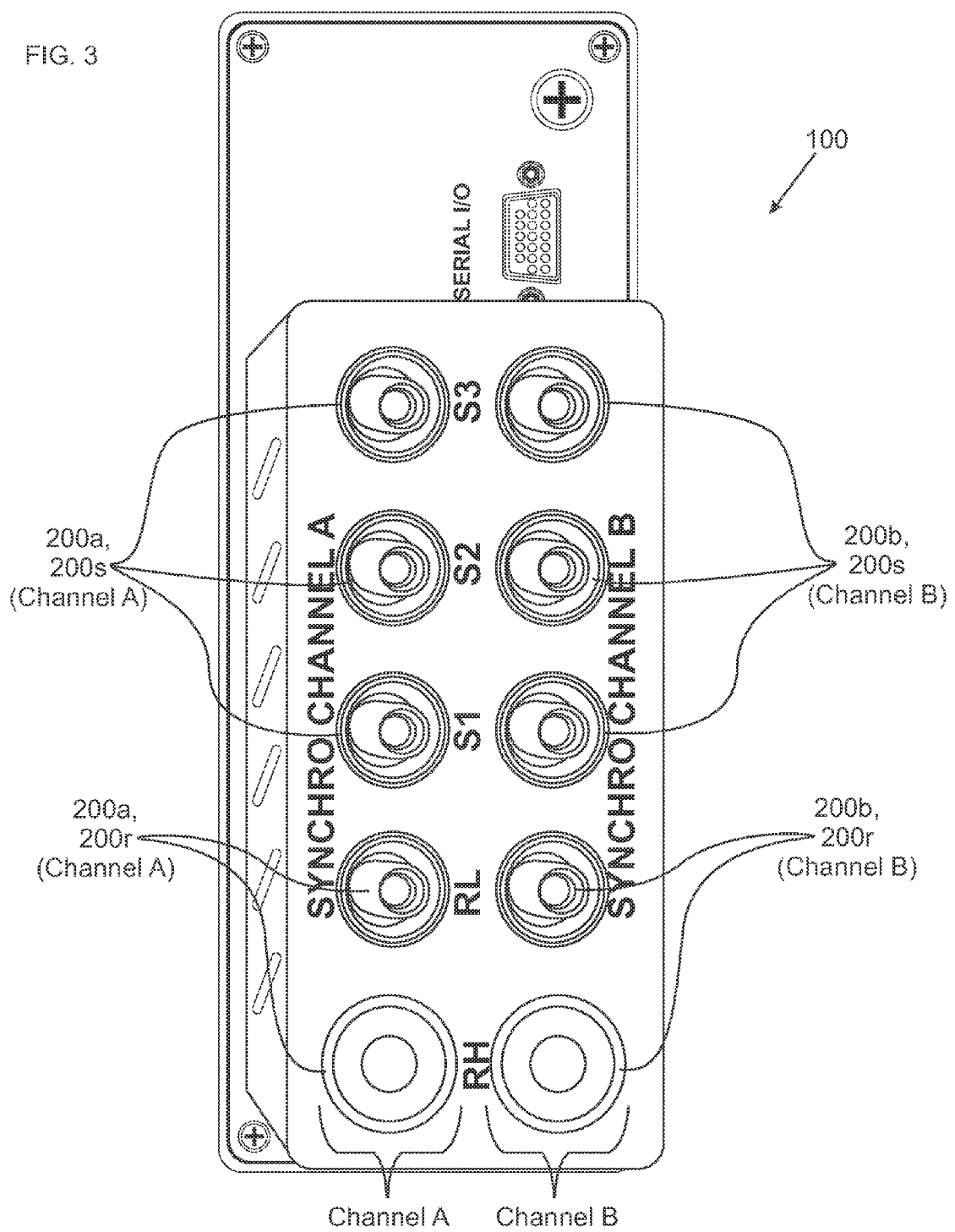
FIG. 3 and FIG. 4 are respective photographic elevation views at opposite ends of the inventive prototype shown in FIG. 1.
Figure 4:
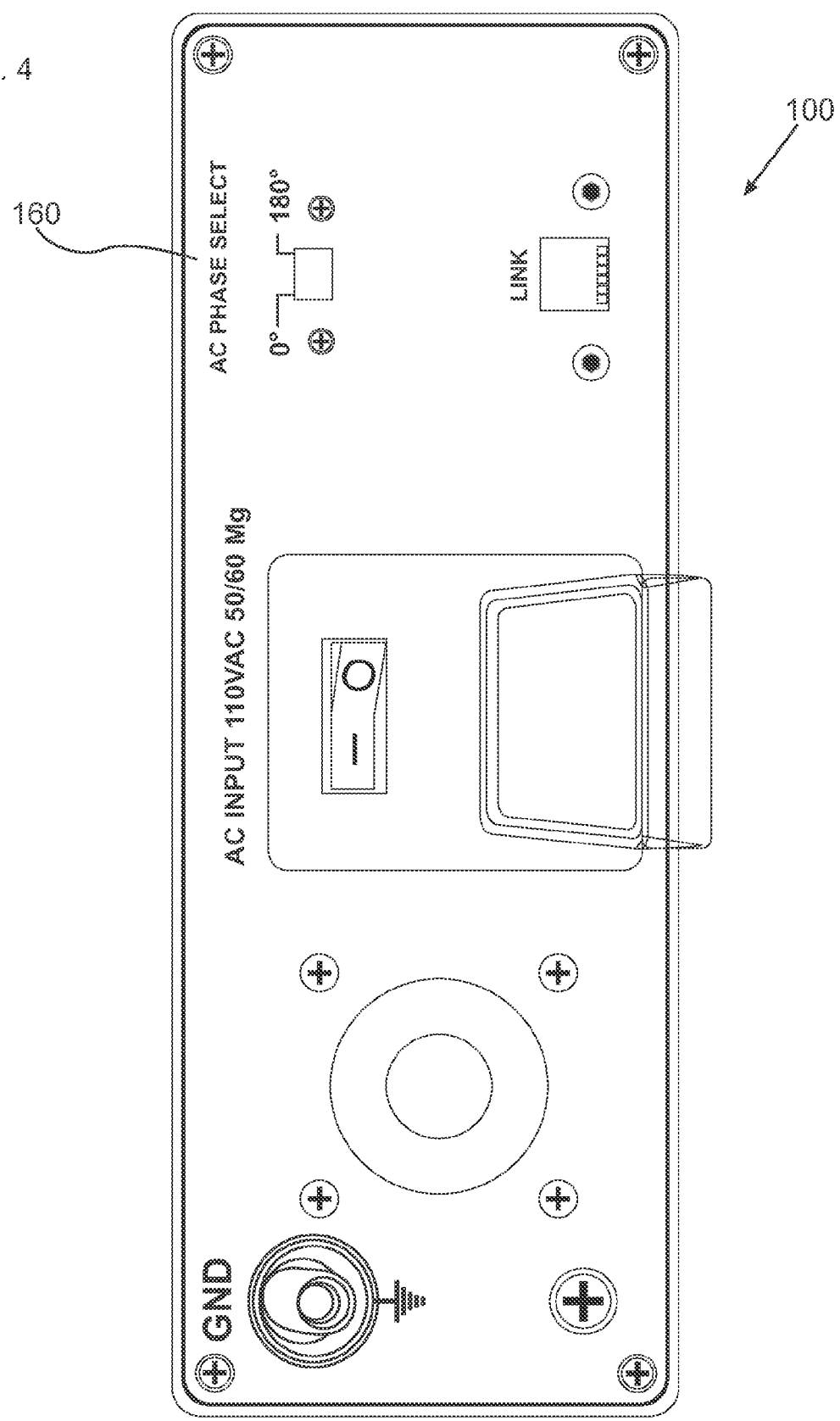

As shown in FIG. 3, the inventive device has two channels, viz., Channel "A" and Channel "B." Each channel has associated therewith five ports 200, namely, the two reference ports 200R (namely, R1/RH and R2/RL) and the three synchro ports 200S (namely, S1, S2, and S3). The upper row of five ports corresponds to channel A; the lower row of five ports corresponds to channel B. The five ports 200 that each channel has are interface points through which signals transmit in order to host a device on other end.

The inventive device's interface panel can be equipped with special female plugs that prevent direct contact with live 120 VAC or 90 VAC signals. Special male connectors, having retractable insulated sleeves, can be used to make good contact with the ports. The sleeves provide an extra measure of safety to the user while plugging or unplugging. On the opposite end of the inventive unit, alligator pin connectors connect directly to terminal boards and provide firm grips.

The phase swap switch 160 is useful in case R1 and R2 are swapped at the inventive unit's end or on the testing end. This permits the user to keep the inventive device on, and to swap the R1 and R2 signals without swapping a physical connection on either end. The swap switch serves to reverse reference signals. The reference inputs R1 and R2 are used as reference outputs R1 and R2, but users may swap these pins by moving a swap switch to the right or left.

Figure 2:
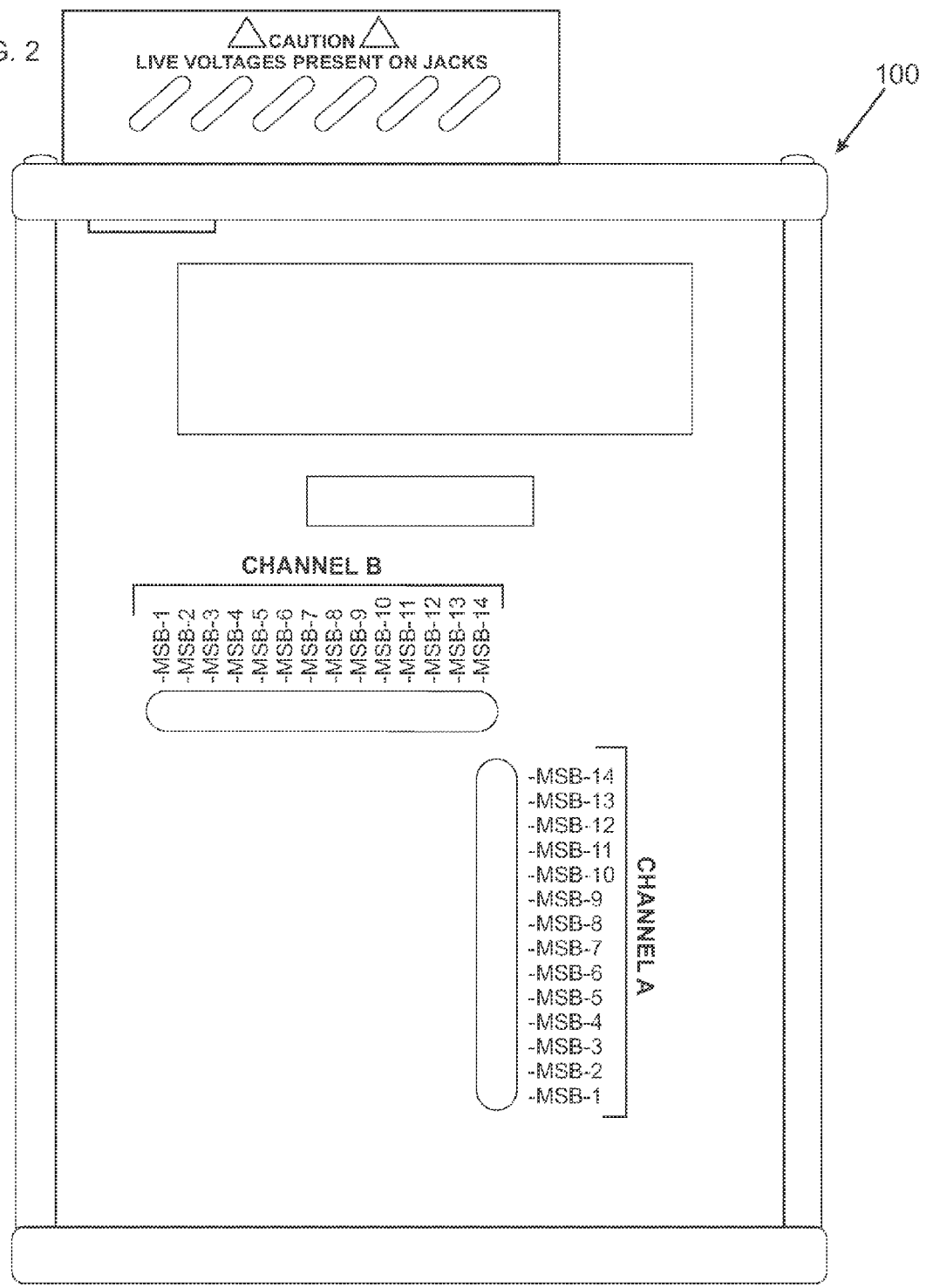
FIG. 2 is a photographic bottom plan view of the inventive prototype shown in FIG. 1.

The inventive device's bottom face, shown in FIG. 2, displays a 14-bit LED representation of channel A and channel B. Using this indicator, a user can verify correct bit patterns for an entered angle value. This type of functionality can ensure that the inventive device is operational regardless of whether a fuse has blown or a synchro signal has a 0V magnitude.

Output channels A and B of inventive device 100 are associated with variously rated protection/safety fuses 220, shown in FIG. 5. The equipping of an inventive device with fuses 220 represents a safety feature for the user. The fuses 220 can prevent damage to inventive device 100, or to devices connected thereto, due to a short circuit or ground currents or high load currents, such as when the user makes a mistake while connecting cables.

The inventive device is capable of displaying actual output values of synchro signals in angle format. For instance, to generate synchro signals of 4× on channel A, the user needs to configure channel A as 4× synchro in the setup menu, and then enter a rudder angle of −15 (Left 15) degrees; this procedure will automatically output the 300 degree equivalent synchro signal on channel A. While configuring 36×, such as for heading information, channel A can be used as "fine" and channel B can be used as "coarse," or vice versa.

Figure 9A:
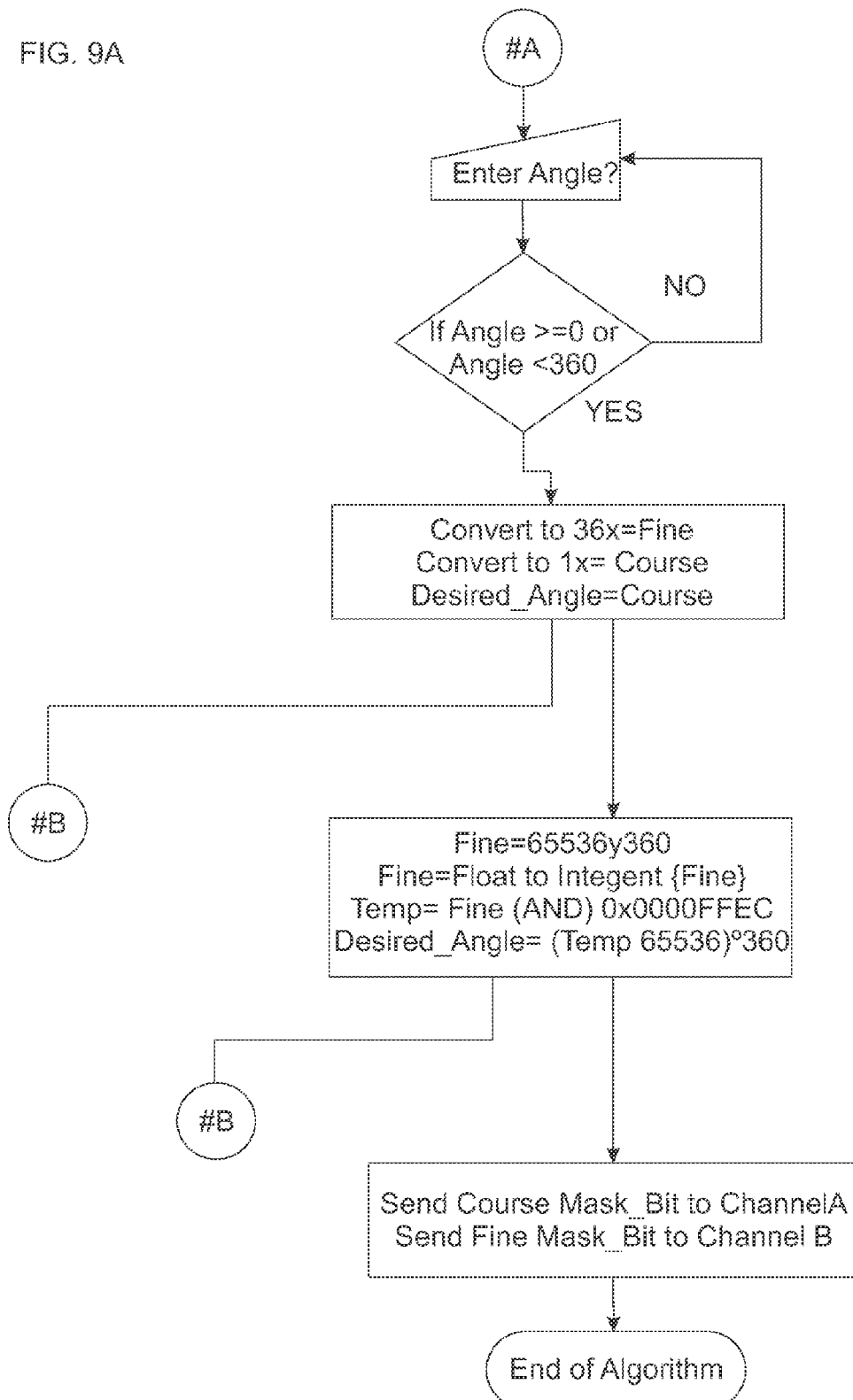
Figure 9B:
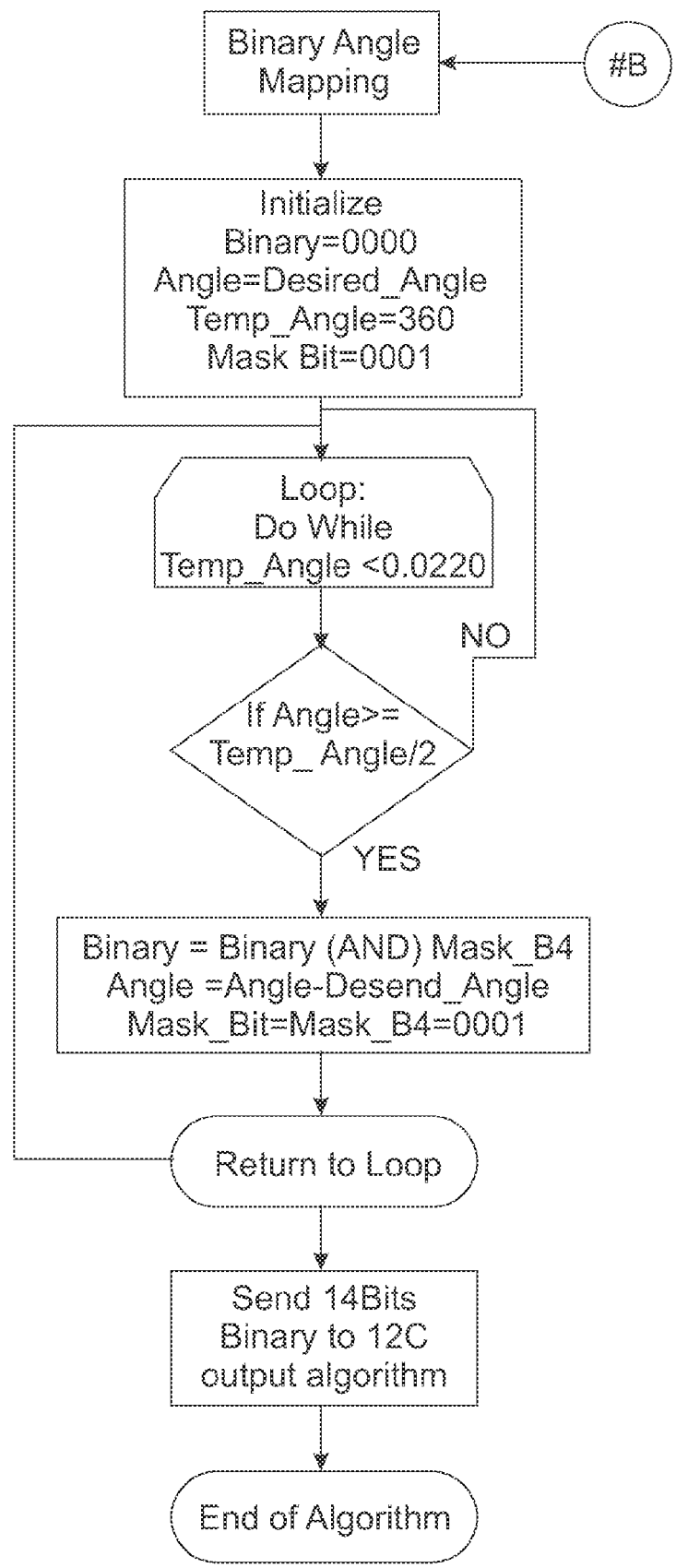
Figure 10:
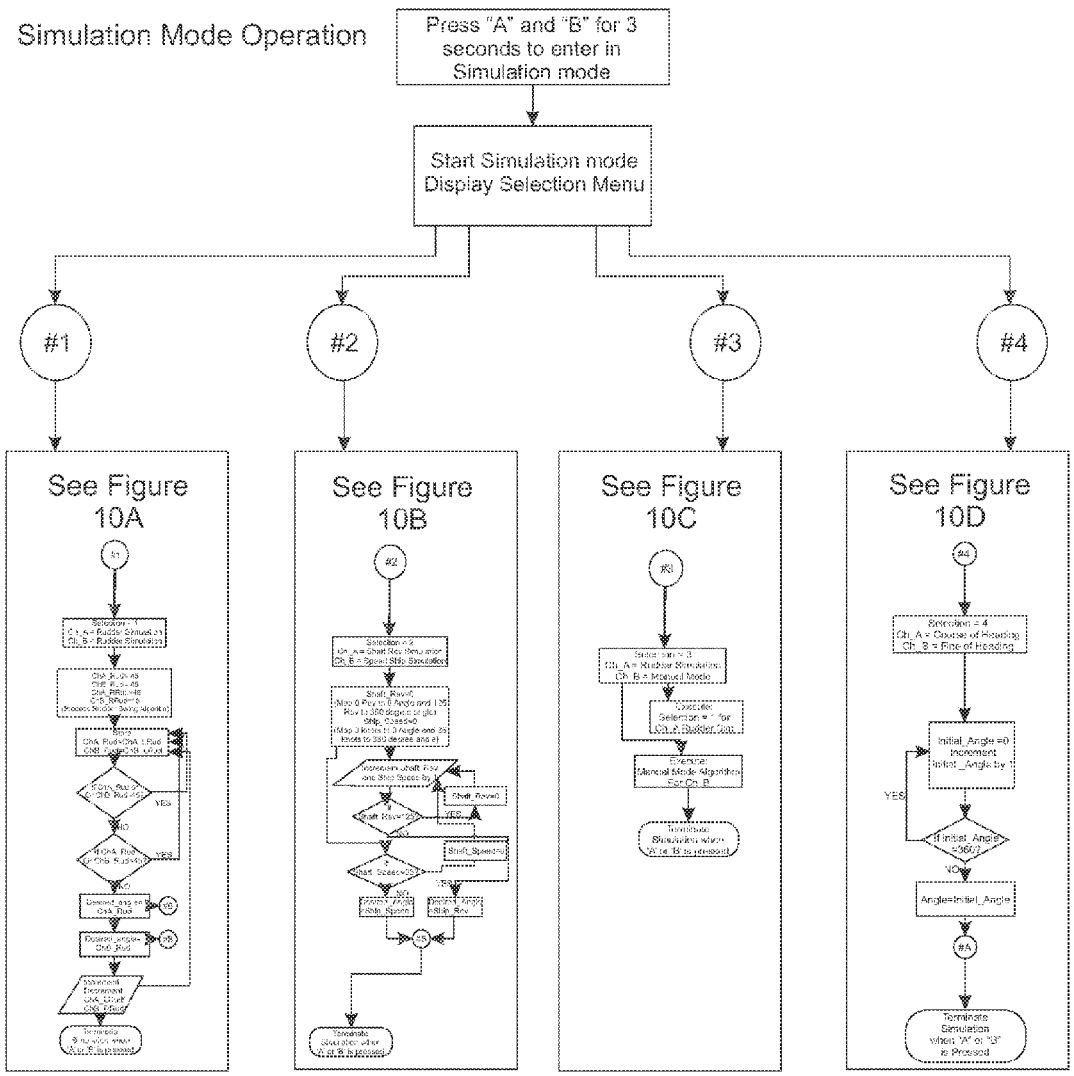
FIG. 10 is a flow diagram illustrating an overview of typical practice of "Simulation" synchro signal generation in accordance with the present invention.
Figure 10A:
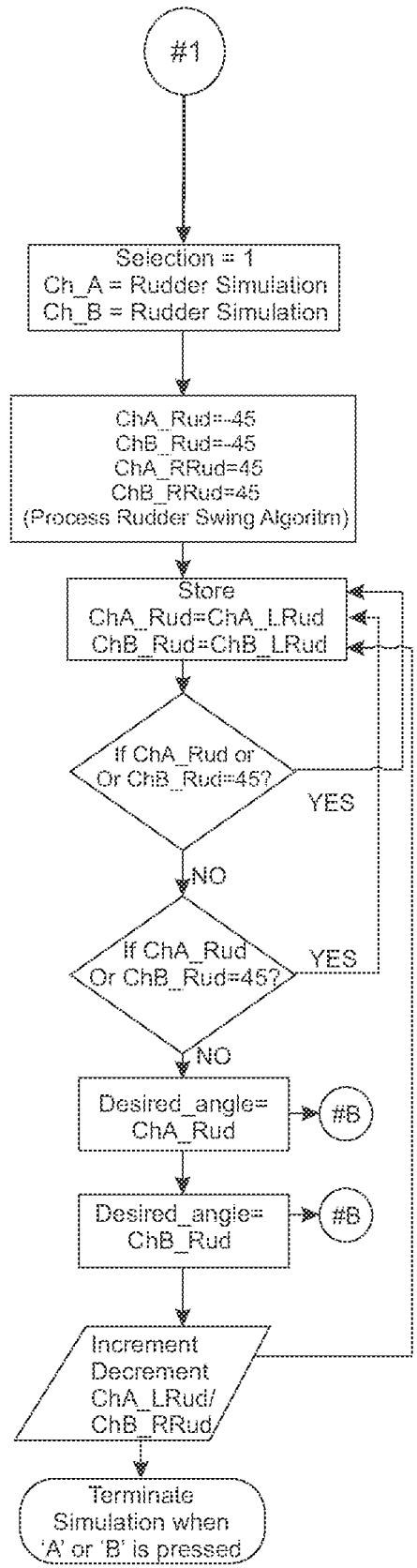
FIG. 10A, FIG. 10B, FIG. 10C, and FIG. 10D are enlarged portions of FIG. 10, illustrating algorithmic details and together representing the entire FIG. 10.
Figure 10B:
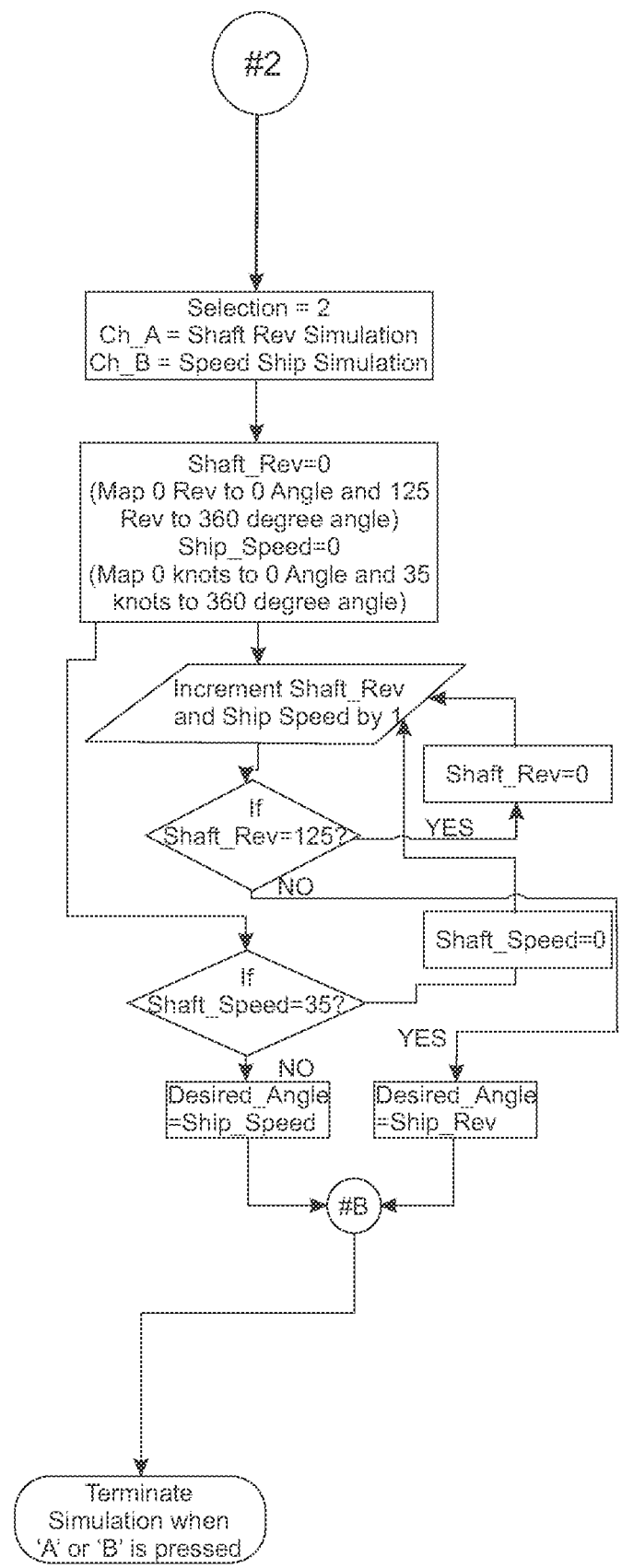
Figure 10C:
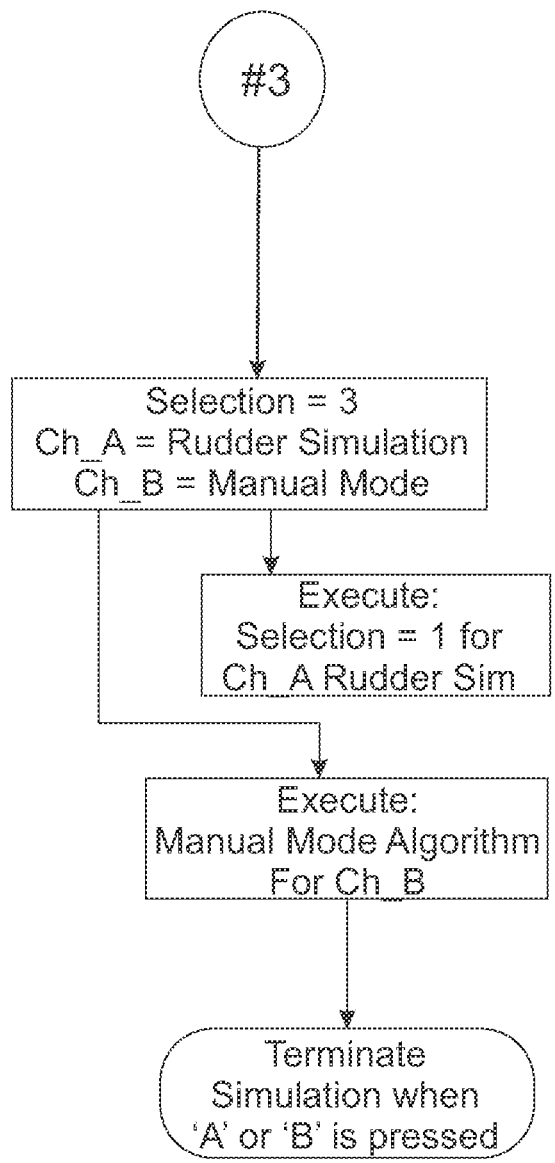

With reference to FIGS. 9 and 10, the inventive device shown herein by way of example can be operated in any of three different modes, viz, (i) Manual Mode, (ii) Simulation Mode, and (iii) Mixed Mode. Mixed Mode represents a combination of Manual Mode (which is on a first channel) and Simulation Mode (which is on a second channel).

Manual Mode (Stable Output Mode)

Referring to FIGS. 9 through 9C, "Manual Mode" is synonymously referred to herein as "Non-Simulation Mode" or "Stable Output Mode." According to the present invention's manual mode, the inventive device 100 outputs a fixed synchro signal to represent a particular value on either channel, as per the user's configuration. Manual mode can hold a selected type of synchro signal multiplier on one channel, while configuring the other channel for a selected different type of synchro multiplier. The inventive device can also hold the desired output angle values until they are changed by the user.

According to basic operational principles of manual mode, the inventive device generates 3-Phase AC signals (S1, S2, and S3) of different amplitudes. The respective amplitudes of the signals combine to represent an angle. For instance, if an AC motor's rotor is moving from a zero degree position to 270 degrees, then the S1–S3 voltage difference (i.e., the voltage difference between the S1 and S3 signals) should equal 90 VAC; the S2–S3 voltage difference should equal 45 VAC; the S1–S2 voltage difference should equal 45 VAC.

In order to generate these three signals (S1, S2, S3) with accurate magnitudes, the 14-bit binary value fed to internal circuitry must represent numerical values from 0 to 360. For example, 10 0000 0000 0000 binary value is equivalent to 180 degrees, and 01 0000 0000 0000 is equivalent to 90 degrees. The sum of these two binary values is 11 0000 0000 0000, which represents 270 degrees.

The inventive device 100 has an LCD screen 140 that prompts users to enter a desired angle value using a retrofitted keypad 150. If the user wishes to rotate a rotor from 0 degrees to 270 degrees, he or she will enter a value of 270 after the prompt using the keypad. The inventive device accepts the numerical value "270," and then converts it to a 14-bit binary value. This conversion from a decimal value to a binary value is accomplished by the inventive device by passing the decimal ("270") input through the present invention's mathematical masking algorithm 1200 via a computer, namely, microcontroller 120, which has a processor and a memory.

Inventive decimal-to-binary conversion algorithm 1200 is resident in the memory of microcontroller 120. As illustrated in FIG. 10, according to the inventive algorithm 1200, the BAM_Bx application continually adds one second based on a pass/fail condition, which forms a 14-bit value of an angle. If the Angle Buffer value is zero, it sends an acknowledgment to the microcontroller 120. Using the previous example of a 270 degree representation, the generated 14-bit value of 11 0000 0000 0000 is then output serially to the internal circuitry.

The I2C serial data then gets converted, by serial-to-binary data converter 130, to a parallel 14-bit value of 11 0000 0000 0000. This parallel 14-bit data is sent over a 14-bit parallel data bus 190, which connects to a digital-to-synchro converter 110. Voltage differences are generated, by the digital-to-synchro converter 110, between S1 and S3, between S2 and S3, and between S1 and S2. The S1–S3 voltage difference=90 VAC; the S2–S3 voltage difference=45 VAC, the S1–S2 voltage difference=45 VAC. These three signals, in addition to two fixed 120 VAC reference signals (R1 and R2), are connected directly to a synchro device such as a motor. Based on the voltage differences between S1, S2, and S3, the rotor rotates precisely to 270 degrees.

The above three paragraphs describe entry of a desired decimal value (e.g., angle value) into an inventive device, and generation by the inventive device of synchro signals in accordance with the entered decimal value. Nevertheless, the above example illustrates generation of "1×" (one-speed)

synchro signals. An inventive device can be embodied so as to be capable of generating multispeed synchro signals, such as 0.7×, 2×, 4×, 36×, etc. The ability to generate multispeed synchro signals is important because many motors and other synchro devices run using multispeed mode.

Single-speed synchro systems implement one speed of data transmission. Accuracy of transmitted synchro data may be unacceptable if small changes in the data cannot be detected, such as can occur when the data covers a wide range of values. Multispeed synchro systems implement plural speeds of data transmission, and are intended to address deficiencies associated with single-speed data transmission. Data transmission speed is a value representing the number of times a synchro transmitter rotor turns 360 degrees in order to transmit a full range of values.

For example, let us assume that a given motor accepts 2× (double speed) synchro signals, and that its rotor is currently positioned at 15 degrees. The desired angle for this rotor is 90 degrees. Using this device, the user has an option to select different synchro signal speeds. Prior to entering the angle, the LCD screen 140 prompts the user to select a synchro speed. The user may then enter the desired angle value of 90 degrees. The inventive device's microcontroller 120 will then multiply the entered value by two and generate a 14-bit binary value mapped to 180 degrees (90 degrees×2×). The binary value of 10 0000 0000 0000 will be output to additional circuitry, and then the rest of the inventive operation is similar to the above-described 1× speed example.

Therefore, according to typical inventive practice, a single inventive device can output variable speeds of synchro signals, and can generate both single and multispeed signals. Typical inventive practice offers these capabilities and other attributes, such as compactness, lightness in weight, and ease of use (e.g., the electronic user interface). A typical inventive device offers two sets of output channels, that is, is capable of setting two different angles by generating two different sets of synchro signals. These separate channels can be connected to a single synchro device that requires two channels of synchro input signals, or connected to two separate synchro devices at the same time.

According to exemplary practice described herein with reference to FIGS. 1-7, a channel is selected by pressing a button; at any time, the user selects either channel A or channel B to generate a new angle value, or to modify a current angle value. During channel selection and angle entry mode, the inventive device maintains the previous angle value and multiplier selection (2×, 4×, 36×, etc.), whichever was previously selected. The inventive device keeps transmitting the previous signals, unless the user presses "F" after entering a new angle value. While the inventive device is outputting synchro signals based on an entered angle value, the user can navigate using the LCD screen menu to select different options, without interrupting an ongoing transmission.

On U.S. Navy ships and other vessels, heading data is often transmitted as synchro signals. This data must be displayed to hundredths decimal place accuracy; hence, a 36× gyro and heading data must be presented in 36× format. The inventive math algorithm is written in ANSI C for the microcontroller 120, which generates 36× data without any extra setups. For example, to generate 36× (multispeed) synchro signals on both channels for heading data, the user will select the 36× option by pressing a single button on the keypad. The user will then make two separate inputs to generate heading synchro signals over both channels (A and B).

If the user enters a gyro angle of 270.01, the microcontroller uses a separate function that generates two decimal values, viz: (1) 270.01 degrees×1×=270.01; and, (2) 270.01×36×= 9720.36. These values are known as "coarse of heading" and "fine of heading," respectfully. The coarse value is converted to 14-bit binary, and is transmitted to circuitry that generates S1, S2, and S3 over channel A or channel B (whichever the user selects). The fine value 9720.36 will go through the math and binary bits masking algorithm illustrated in FIG. 9 (manual mode). The final fine heading value will be generated from the same algorithm which, in this case, outputs 0.351. Then, it gets converted to a 14 bits binary number and transmitted to the other available channel, which completes 36× heading data synchro signals generation. Subsequently, these signals are fed to digital or analog gyro to simulate heading data.

To start up the inventive device, a 120V cord is connected to the female socket on the side of the box. The on/off rocker switch must remain off while connecting the cord to an AC source. Upon pressing the rocker switch to "I" position, the inventive device will usually boot up within 30 seconds. If the LCD screens remain blank while the backlight is on, the user can try restarting the inventive device.

Upon successful boot up, the dsPIC microcontroller starts executing on-board code and displays a menu on LCD screen 140. "A" is pressed to configure channel A, and/or B is pressed to configure channel B. "F" is pressed to enter a value. The user must configure channel A or channel B before entering any values. After selecting either channel (A or B) to output a synchro signal, the user will see a new menu on the LCD screen. The user must select a Synchro Type option.

For instance, the user can select the 2× synchro, and upon pressing the "F" (enter) button, the inventive device will prompt the user to enter the desired angle. The user enters a decimal value for an actual angle and presses the "F" (enter) button, whereupon the actual angle and the output angle, each in decimal form, are displayed on the LCD screen. The user can press "A" to reset the synchro signal type for channel A, or can press "B" to reset the synchro signal type for channel B. To change channel A or channel B to another type of synchro signal selection, they must press "A" or "B," respectively, to reset it. For instance, instead of 2×, other types of synchro signals can be set for channel A or channel B, e.g., 0.7×, 1×, 2×, 4×, SPD, or PITCH.

For instance, to generate a 36× type synchro signal, the user presses A or B to select one channel for "coarse" angle and the other channel for "fine" angle. To illustrate, the user can select channel A to configure 36× coarse angle value, for instance 123 degrees, and then enter the angle, which will appear on the output screen on channel A. Meanwhile channel B will be automatically configured as the fine angle channel, and will output a fine 36× value on channel B. The output value=(123 degrees×36×65,536)/360. The output value will be masked to 14 bits to convert to a BAM value that will generate a 14-bit equivalent fine synchro angle. All of the above complex calculations take place in the present invention's computer code, and the user need not perform the calculations. Similarly, the channel B as coarse angle configuration can be set up by selecting channel B so as to automatically set channel A as the fine angle channel.

The present invention can be embodied to generate UDV (User Defined Variable) type synchro signals. Generally speaking, few conventional synchro-related systems accept rare types of synchro signals, such as 0.7×, 11×, or 12.4×. When desired synchro signals are of a rare type, the users can select channel A or B, and then select a multiplier option (e.g., 11×). The user enters the value of the multiplier, and then enters the desired angle, which is multiplied automatically with the input multiplier (e.g., 11×).

Simulation Mode

Figure 10D:
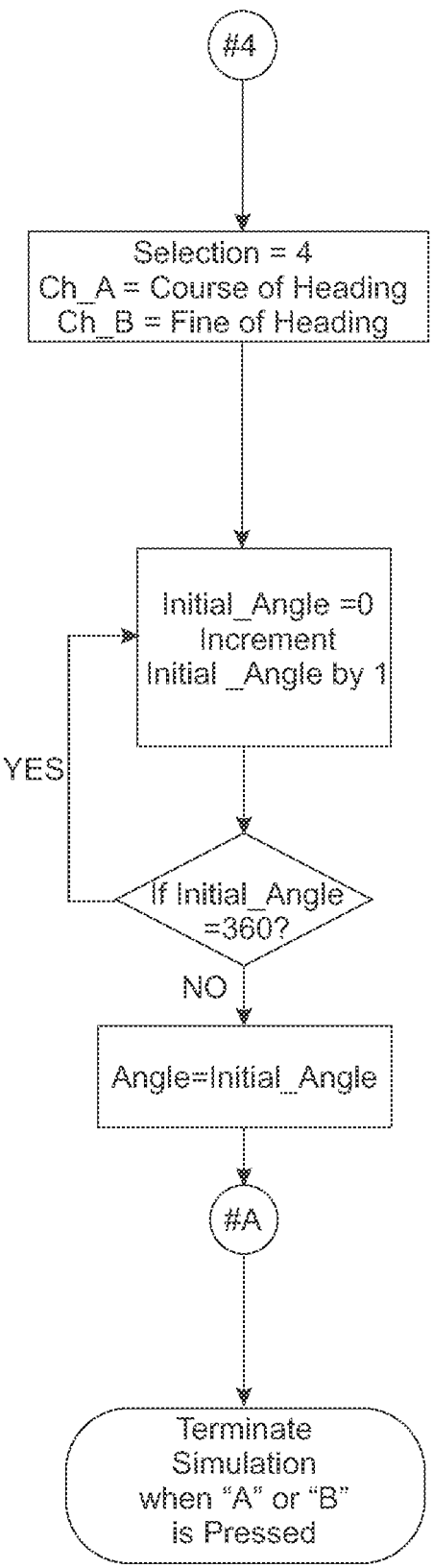

Reference is now made to FIGS. 10 through 10D. According to the Simulation mode of inventive prototype 100, the user has the choice of four options to set the inventive device's channels, viz., rudder angle swing, speed, RPM swing (pitch), and heading (coarse and fine angles). For instance, channel A and channel B can each be set to rudder angle swing simulation; or, channel A and channel B can be set to speed simulation and RPM swing simulation, respectively; or, channel A and channel B can each be set to heading (coarse and fine angles) simulation mode; etc.

According to basic operational principles of the simulation mode of the inventive prototype 100, a user can invoke simulation mode at any time by pressing the "A" and "B" keys together for at least three seconds. The simulation mode menu will be displayed with four possible selections. The functioning code for simulation operation is based on different timer interruptions, and it involves function calls such as 36× gyro heading math conversions, decimal to 14-bit binary conversion, as well as other calculations. Configuring channels A and B in manual mode prior to selecting simulation mode is required. The multiplier values of channels A and B will be recalled by the controller, and implemented during simulation mode.

The user can set the inventive device to simulate rudder synchro signals, gyro heading signals, heading, shaft revolution synchro signals, and ship speed synchro signals. The signals are available on either channel, A or B, and can be fed to a related system on the ship to verify synchro cable wiring and distribution, and to check that data is being displayed by software on other human-machine interfaces. This can ensure that software gets proper synchro signal based data (rudder, speed, heading, and shaft revolutions), which are not available during the installation period.

The inventive device can be plugged into a junction box to feed synchro signals, and into a synchro meter (reader unit) at the other end, thereby ensuring that input data at the junction boxes match the output data on the synchro meter. This validates that all five required cables (R1, R2, S1, S2, and S3) are lined up correctly, and that there is no present danger such as a short between cables, insufficient grounding, or swapped cables. A common mistake encountered by shipboard engineers is the swapping of two or more cables from among these five cables. This kind of error can cause major damage to the system at the other end, as all synchro signal cables must be correctly lined up.

According to typical inventive practice, simulation mode generates synchro signals at the same speed selected during manual mode operation. This furthers convenience for the user to switch between the two modes. The internal main controlled board is equipped with a I2C data bus chip, a dsPIC30F6014A 80 pin controller, and an external oscillator for 16× speed to accomplish floating points operations. The onboard I2C two-pin connector and serial bus port are also embedded for daisy chain interface of the inventive device. The two re-set buttons are mounted on the printed circuit board on the bottom of the box, to reset the controller and the I2C data bus if there is unit malfunction. The user must take precaution to do so because any metal contact to the PCB circuit may damage the inventive unit. An electrically non-conductive stick can be used to press this button through the associated holes. The simulation mode is designed to act in a smart way whereby the user does not have to perform any mathematical conversion before entering any angle.

The rudder simulation mode is one of the sub-modes of inventive practice of simulation mode. For example, to have −45 (left) degrees to 45 (right) degrees of continuous rudder angle swing in 4× synchro type signal, the user must perform the following steps: (i) configure channel A in 4× mode (Entering an angle is not necessary); (ii) configure channel B in 4× mode (Again, entering an angle is not necessary); (iii) press "A" and "B" together for more than 5 seconds; (iv) view simulation mode menu displayed on LCD screen; (v) select option 1 (channel A and channel B will output rudder simulation angle) and press F. The inventive device will output rudder angle of 4× type synchro on both channels, and the user will be able to see the desired angle and actual angle on the LCD screen.

Another sub-mode of simulation mode of the inventive prototype is the heading simulation mode. The heading simulation mode can be triggered by repeating steps (i) through (iv) described above with regard to the rudder simulation mode, and continuing by selecting option 4 (channel A as coarse angle by default. and channel B as fine angle by default) and then pressing F (enter), whereupon the inventive device begins simulating heading from 0 to 360 degrees and 360 to 0 degrees. The coarse angle will be available on channel A (1× synchro type) and the fine angle will be available on channel B (36× synchro type). The inventive device will display the desired angle and the actual angle on the LCD screen.

Another inventive sub-mode is the speed and RPM (pitch) simulation mode. The Speed of the ship ranges from 0 to 35 knots, and the RPM ranges from 0 to 125. The inventive controller firmware is designed to convert 0 to 35 knots scaled with a 0 to 360 degree synchro angle. The RPM value 0 to 125 is scaled with 0 to 360 as well. When selecting this option for simulation, channel A will be speed simulation channel and channel B will be RPM simulation channel, by default. Steps (i) through (iv), described above, are repeated, the user continues by selecting option 2 and pressing F (Enter), and simulation begins. Channel B outputs a continuous rudder angle swing from −45 to 45 degrees (equivalent synchro signal). Channel A swings from 0 to 35 knots.

Mixed Mode

According to typical practice of the present invention's mixed mode operation, one channel is configured for simulated mode and the other channel is configured for manual mode (non-simulated mode). This present invention's mixed mode option thus offers flexibility to maintain one channel in stable mode and the other channel in simulation (e.g., rudder simulation) mode.

For instance, channel A can be configured for rudder simulation, and channel B for manual mode, in the following manner. The user presses "B" and selects a synchro type signal, then enters the desired angle on channel B, and then presses "F." In addition, the user presses "A" and "B" together for 5 seconds (whereupon the simulation menu pops up on the LCD screen), and selects option "3," according to which channel A is configured as rudder simulator and B remains as is. The user presses "F" and the simulation starts only for channel A, while channel B holds the last values of the multiplier and the angle.

Multi-Device Daisy Chain Configuration

Figure 11:
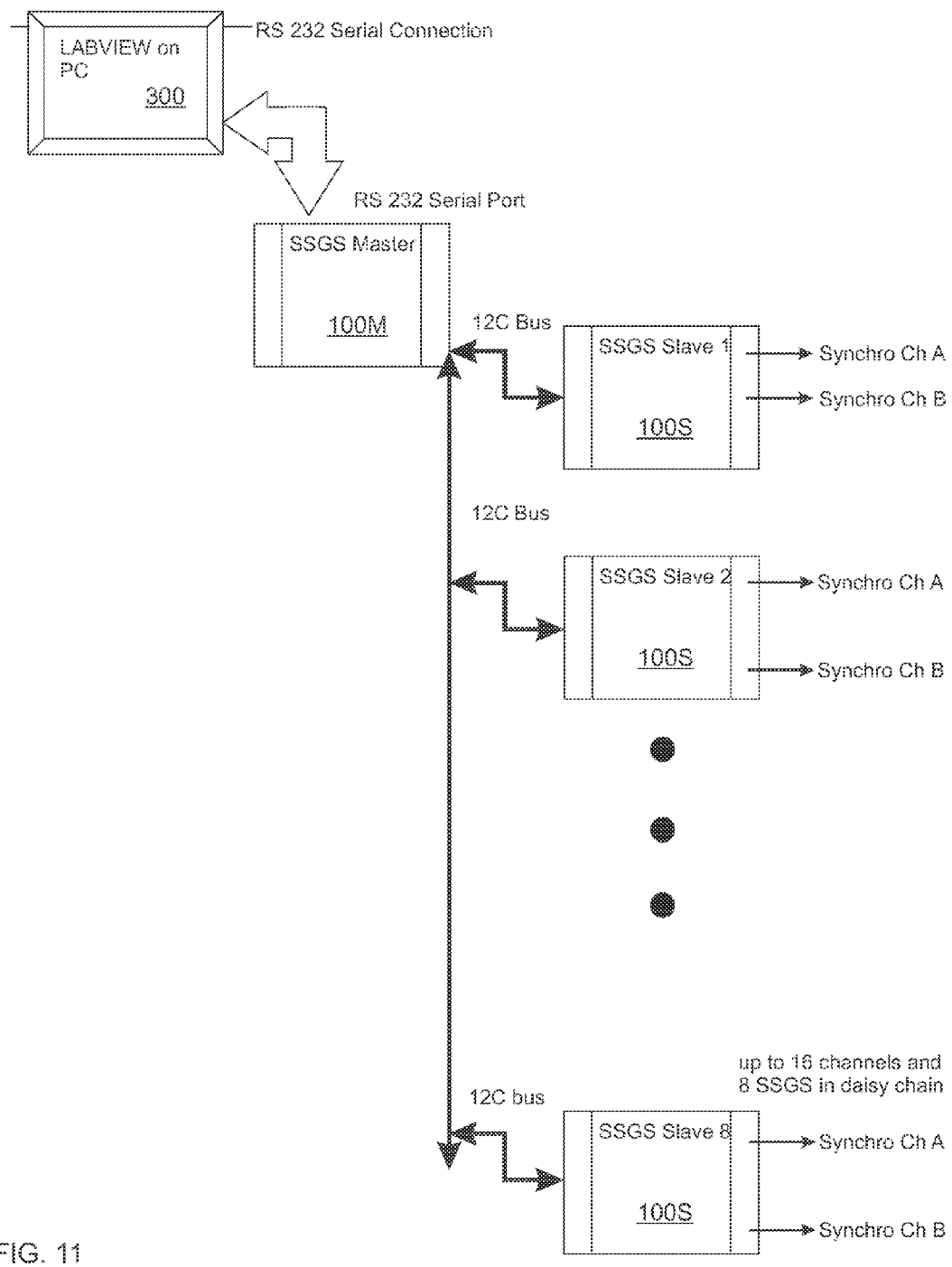
FIG. 11 is a schematic illustrative of typical inventive practice of a "master-slave" configuration involving an I²C ("I-squared-C," commonly denoted "I2C") serial bus connection between a "master" synchro generator and plural "servant" synchro generators.

FIG. 11 illustrates interfacing, connectivity, and I2C address assignment for inventive practice involving a "master" inventive device and plural "slave" inventive devices. The terms "master" and "slave" are commonly used in the electromechanical arts to describe a relationship between a controlling device ("master") and a responding device ("slave"). The user can operate and control every inventive slave unit 100S using a computer (e.g. a personal computer) 300 that is connected to the inventive master unit 100M, and that is equipped with a LabVIEW graphical user interface.

LabVIEW is system design software, commercially available, manufactured by National Instruments. Two or more inventive slave units 100S, typically similar to each other, can be connected (e.g., daisy-chained) together and to the inventive master unit 100M, via an I2C serial port on the master inventive unit 100M, which is connected to PC 300 equipped with the LabVIEW software environment. As depicted in FIG. 11, up to eight inventive devices 100 similar to that shown in FIGS. 1-7 are connected in a daisy chain interface, thereby affording up to sixteen synchro output channels. Practically any number of inventive devices, connected in a daisy chain, can be practiced in accordance with the present invention.

To control more than two channels of this chain, an interface can run from a computer (e.g., a PC) in Labview software or similar application. Using this program, multiple synchro signals can be configured and output to desired channels of daisy-chained inventive devices. For instance, the DIP switch setting can be set to a unique bus address to access a particular inventive device 100S, which is assigned that unique bus address. The dsPIC controller firmware receives data from the PC via a serial port, and sends it to a specific bus address; and a synchro signal is thus generated on the selected channel. The inventive device 100's RS232 serial port can be integrated for many purposes on the board, such as providing LabVIEW interface or even internet/intranet interface.

FIG. 11 shows a LabVIEW interface having a maximum of sixteen synchro channels available on eight inventive devices that are daisy-chained via an I2C bus connection. For instance, in a case of eight inventive slave devices 100S having sixteen channels, one of the inventive devices 100S can have its channel B set to 170 degrees, while the fifteen remaining channels are set to zero. During setup of this arrangement, the LCD screens on the inventive devices should remain blank and the keypads disabled. The LabVIEW software, resident in the memory of the PC, outputs desired synchro angle information to the master inventive device 100M via the RS 232 serial port. Only the master inventive device 100M connects with the PC 300, while the slave inventive devices 100S ("stations" or "clients") are daisy-chained with each other via the I2C bus connection.

An inventive multi-unit configuration such as shown in FIG. 11 can be propitious in providing numerous channels by implementing numerous stations (each station having one channel or plural channels) associated with a central control. Additional features can be added to an inventive multi-unit configuration. For instance, digital boolean values can be sent from the software for purposes of testing alarms and/or indicators. Numerous digital-out signals can be turned on/off individually.

The present invention, which is disclosed herein, is not to be limited by the embodiments described or illustrated herein, which are given by way of example and not of limitation. Other embodiments of the present invention will be apparent to those skilled in the art from a consideration of the instant disclosure, or from practice of the present invention. Various omissions, modifications, and changes to the principles disclosed herein may be made by one skilled in the art without departing from the true scope and spirit of the present invention, which is indicated by the following claims.

What is claimed is:

1. A synchro signal generator comprising:
a human-machine interface for entering decimal data;
a computer having resident in its memory a mathematical algorithm for converting said decimal data to serial binary data;
a serial-to-parallel binary data converter for converting said serial binary data to parallel binary data; and
at least one digital-to-synchro converter for converting said parallel binary data to synchro analog data.

2. The synchro signal generator of claim 1, wherein said synchro analog data is suitable for conveyance in synchro signal form to a synchro device.

3. The synchro signal generator of claim 1, wherein said decimal data is decimal angular data, said serial binary data is serial binary angular data, and said parallel binary data is parallel binary angular data.

4. The synchro signal generator of claim 1, wherein said human-machine interface includes a keypad and a display.

5. The synchro signal generator of claim 4, wherein said display is an LCD display.

6. The synchro signal generator of claim 1, wherein said computer is a microcontroller.

7. The synchro signal generator of claim 1, wherein the synchro signal generator is characterized by at least two channels, each said channel having a different said digital-to-synchro converter and being separately connectable to a synchro device for independent conveyance of at least some said synchro analog data in synchro signal form to said synchro device.

8. The synchro signal generator of claim 7, wherein said at least two channels are two channels, and wherein said channels are separately connectable either to the same said synchro device or to two different said synchro devices.

9. The synchro signal generator of claim 1, wherein:
said decimal data describes at least one decimal data category selected from the group of decimal data categories consisting of ship rudder angle data, ship speed data, ship engine shaft revolution data, and ship heading data; and
said mathematical algorithm is capable of processing said decimal data describing any said decimal data category so as to convert said decimal data to serial binary data.

10. The synchro signal generator of claim 9, wherein said ship heading data includes coarse heading data and fine heading data.

11. A method for generating synchro signals, the method comprising entering decimal data in a human-machine interface, converting said decimal data to serial binary data, converting said serial binary data to parallel binary data, and converting said parallel binary data to synchro analog data.

12. The method for generating synchro signals of claim 11, wherein:
said conversion of said decimal data to said serial binary data includes using a computer having resident in its memory an algorithm for effecting said conversion of said decimal data;
said conversion of said serial binary data to said parallel binary data includes using a serial-to-parallel binary data converter;
said conversion of said parallel binary data to said synchro analog data includes using at least one digital-to-synchro converter.

13. The method for generating synchro signals of claim 12, wherein:
said decimal data describes at least one decimal data category selected from the group of decimal data categories consisting of ship rudder angle data, ship speed data, ship engine shaft revolution data, and ship heading data; and
said conversion of said decimal data to serial binary data includes processing said decimal data using algorithmic code pertaining to said decimal data category.

14. The method for generating synchro signals of claim 11, the method further comprising transmitting synchro analog signals to a synchro in accordance with said synchro analog data.

15. The method for generating synchro signals of claim 11, wherein said decimal data is decimal angular data, said serial binary data is serial binary angular data, and said parallel binary data is parallel binary angular data.

16. The method for generating synchro signals of claim 11, wherein said human-machine interface includes a keypad and a display, and wherein said computer is a microcontroller.

17. The method for generating synchro signals of claim 11, wherein:
- said conversion of said parallel binary data to said synchro analog data includes using at least two digital-to-synchro converters;
- each said digital-to-synchro converter corresponds to its own channel for independently transmitting synchro analog data signals to a synchro.

18. The method for generating synchro signals of claim 17, the method further comprising independently transmitting, via each said channel, said synchro analog data signals to a synchro, wherein one of the following applies:
- every said channel is used for independently transmitting said synchro analog data signals to a different said synchro;
- at least two said channels are used for independently transmitting said synchro analog data signals to the same said synchro.

19. The method for generating synchro signals of claim 11, the method further comprising connecting plural synchro data units in a master-slave daisy chain configuration and to a system computer, wherein:
- said serial-to-parallel binary data converter is for converting said serial binary data to parallel binary data;
- said at least one digital-to-synchro converter is for converting said parallel binary data to synchro analog data;
- at least two said synchro data units are slave synchro data units;
- at least one said synchro data unit is a master synchro data unit in a master-slave relationship with respect to said at least two synchro data units;
- said master synchro data unit includes said human-machine interface and a unit computer;
- each said slave synchro data unit includes a serial-to-parallel binary data converter and at least one digital-to-synchro converter;
- said human-machine interface is for entering decimal data in said master synchro data unit;
- said unit computer has resident in its memory an algorithm for effecting said converting of said decimal data;
- said master synchro data unit is connected so said system computer and to each said slave synchro data unit;
- said system computer has resident in its memory an application for effecting said master-slave daisy chain configuration.

20. A system for generating synchro signals, the system comprising
- a system computer having resident in its memory an application for effecting a master-slave daisy chain configuration;
- a master synchro data unit serially connected to said system computer and to said plural synchro data units in a master-slave daisy chain configuration, said master synchro data unit including a human-machine interface for entering decimal data in said master synchro data unit, said master synchro data unit further including a unit computer, said unit computer having resident in its memory an algorithm for converting said decimal data, entered via said human-machine interface, to serial binary data;
- plural slave synchro data units, each said slave synchro data unit including a serial-to-parallel binary data converter for converting said serial binary data, received from said master synchro data unit, to parallel binary data, each slave synchro data unit further including at least one digital-to-synchro converter for converting said parallel binary data, received from serial-to-parallel binary data, to synchro analog data.

\* \* \* \* \*